United States Patent [19]

Naruke

[11] Patent Number: 5,091,882
[45] Date of Patent: Feb. 25, 1992

[54] NONVOLATILE SEMICONDUCTOR MEMORY DEVICE AND METHOD OF OPERATING THE SAME

[75] Inventor: Kiyomi Naruke, Yokohama, Japan

[73] Assignee: Kabushiki Kaisha Toshiba, Kawasaki, Japan

[21] Appl. No.: 559,608

[22] Filed: Jul. 30, 1990

[30] Foreign Application Priority Data

Jul. 31, 1989 [JP] Japan .................................. 1-196836

[51] Int. Cl.⁵ ................................ G11C 11/40
[52] U.S. Cl. .................................. 365/185; 365/218
[58] Field of Search ............... 365/189.01, 182, 185, 365/218

[56] References Cited

U.S. PATENT DOCUMENTS

4,462,090 7/1984 Iizuka .
4,794,565 9/1986 Wu et al. .
4,967,393 10/1990 Yokoyama .......................... 365/185

FOREIGN PATENT DOCUMENTS

0294989 12/1488 European Pat. Off. .
0335395 10/1989 European Pat. Off. .
58-54668 3/1983 Japan .
62-249487 10/1987 Japan .

*Primary Examiner*—Terrell W. Fears
*Attorney, Agent, or Firm*—Banner, Birch, McKie & Beckett

[57] ABSTRACT

In a nonvolatile semiconductor memory device such as EEPROMs which comprises a semiconductor substrate of one conductivity type having source and drain regions of opposite conductivity type for defining a channel region therebetween, and a stacked gate including a gate insulating film, a floating gate and a control gate provided through an interlevel insulator above the floating gate, an erase gate having an electrode is provided above the channel region through an insulating film which is contiguous to the gate insulating film. The erase gate is also insulated from the stacked gate through a side wall insulating film. For removing a charge carrier stored in the floating gate, a high voltage is applied to the erase gate, while grounding the source and drain regions and the control gate, respectively.

11 Claims, 7 Drawing Sheets

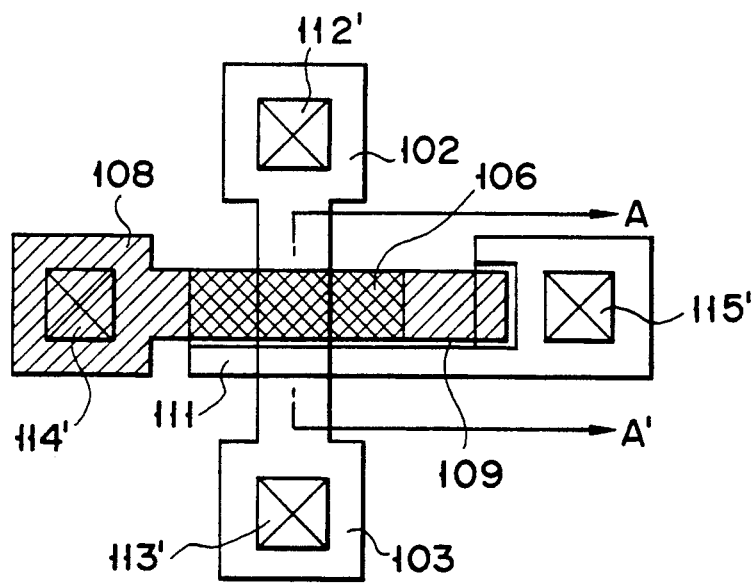
F I G. 1
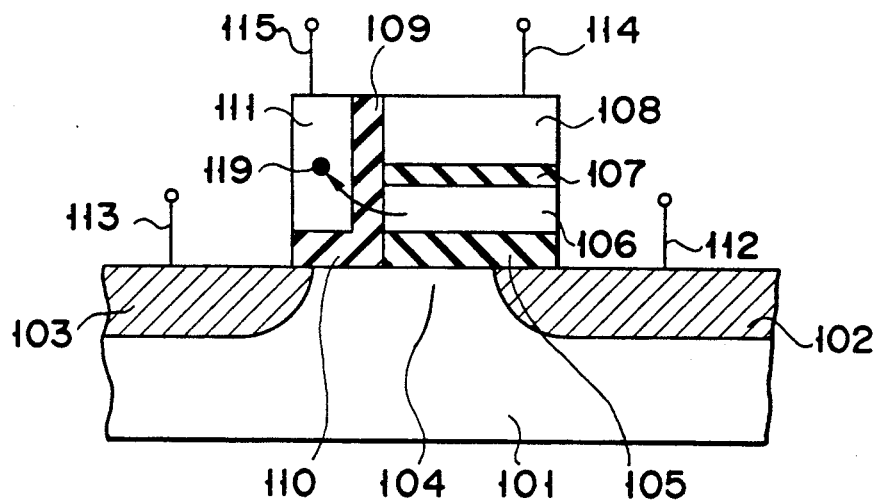
F I G. 2

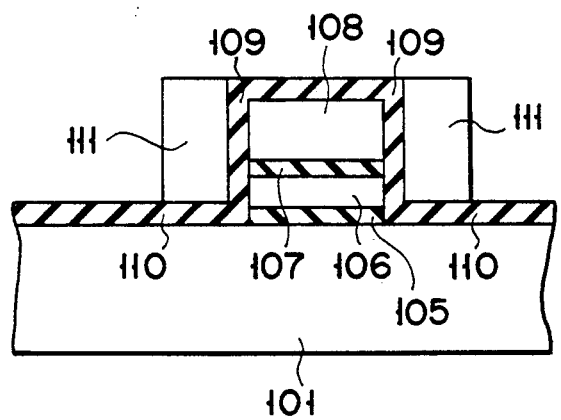
F I G. 3D
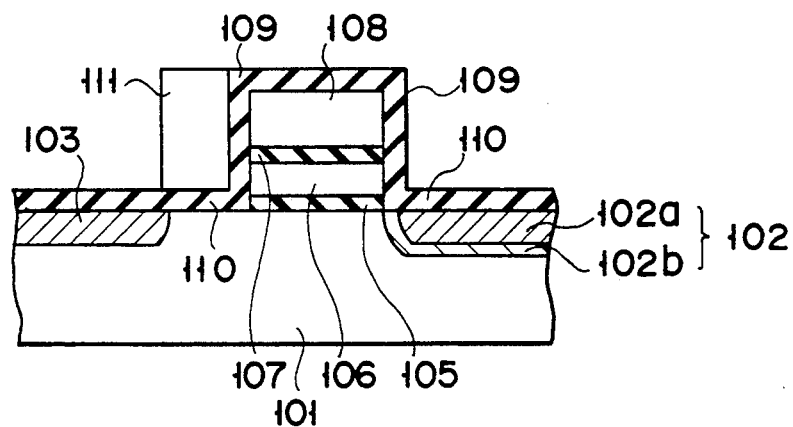
F I G. 3E
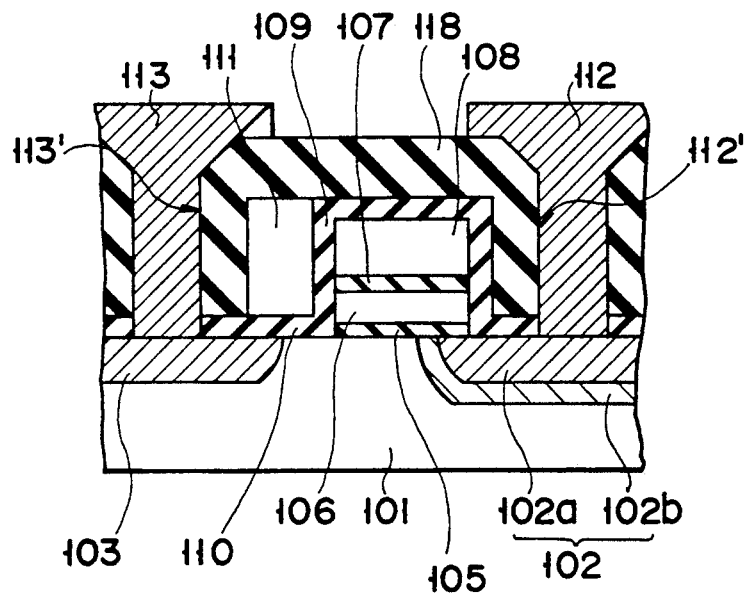
F I G. 3F

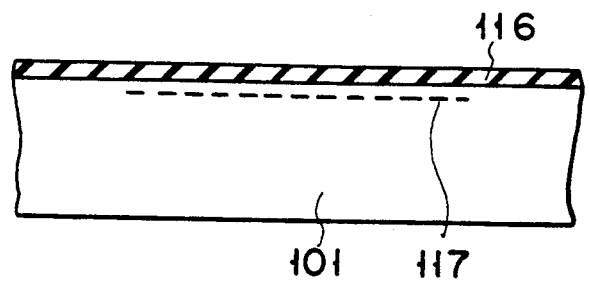
F I G. 6A
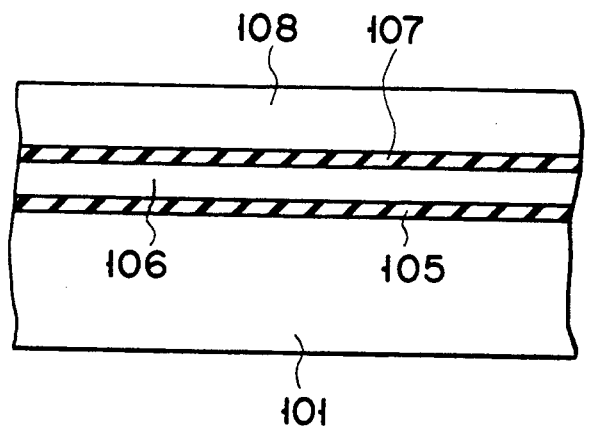
F I G. 6B
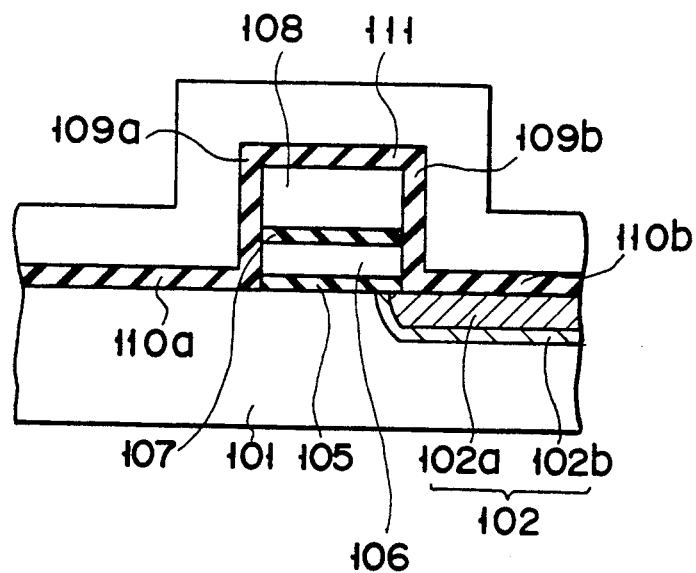
F I G. 6C

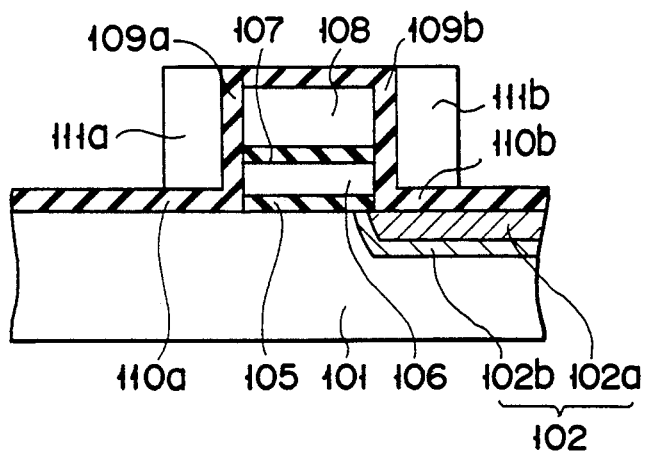
F I G. 6D
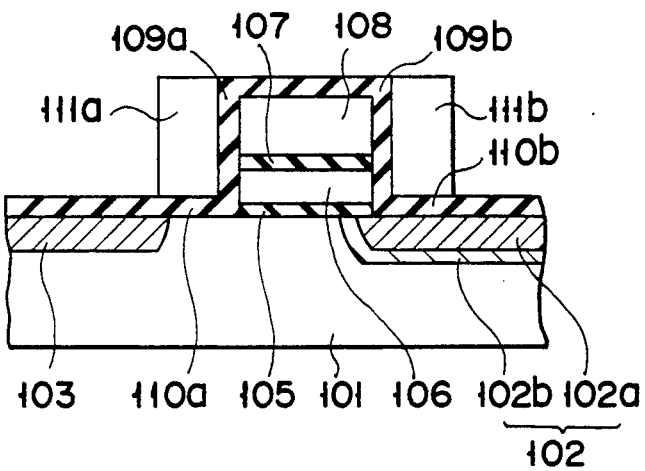
F I G. 6E
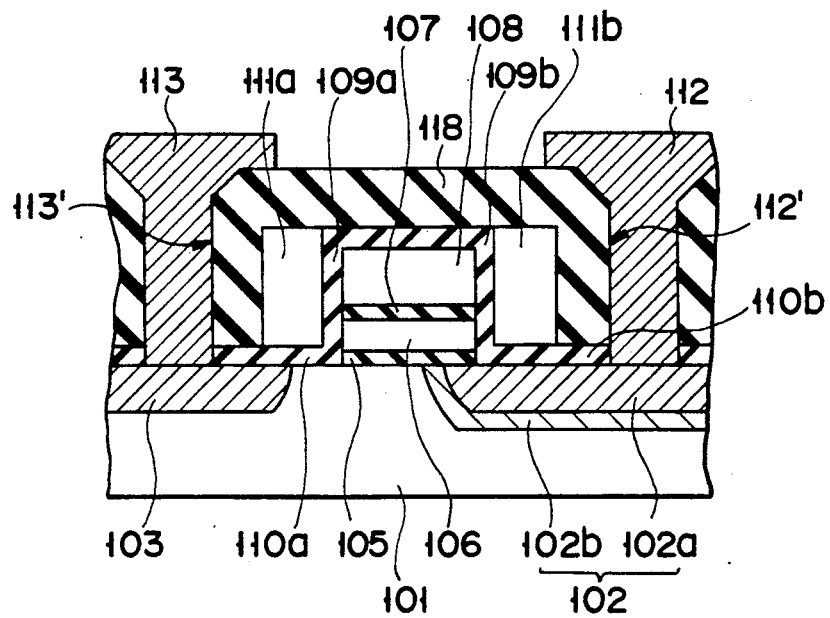
F I G. 6F

NONVOLATILE SEMICONDUCTOR MEMORY DEVICE AND METHOD OF OPERATING THE SAME

BACKGROUND OF THE INVENTION

1. Field of the Invention

The present invention relates to a nonvolatile semiconductor memory device and a method of erasing stored information from the nonvolatile semiconductor device, and more particularly, to a nonvolatile semiconductor memory device such as EEPROMs (Electrically Erasable and Programmable Read Only Memory) capable of electrically erasing stored information and a method of erasing stored information thereof.

2. Description of the Related Art

As one of the nonvolatile semiconductor memory devices, EEPROMs have been known. In the EEPROM, information can be electrically written and read out, and the feature may be to erase electrically stored information.

In order to erase the electrically stored information, a charge carrier stored in a floating gate must be removed, using a tunneling phenomenon (this tunnelling phenomenon has been known as, especially, the Fowler Nordheim tunnelling phenomenon) of a thin insulating film. According to a conventional erasing method, a high voltage is applied to a source or drain region provided in a semiconductor substrate to render a high electric field to the floating gate. As a result, a charge carrier (electrons in this case) stored in the floating gate is removed to the source or drain region through a gate insulating film. However, since the charge carrier is removed to the source or drain region provided in the substrate, a large number of electrons or holes are generated at the interface between the gate insulating film and the source or drain region, so that an excess source or drain current flows therethrough during erasing.

The problem of the excess current flowing through the source or drain region during erasing of the stored information will be described below with reference to accompanying drawings, using a memory cell of EEPROM, comprised of a p-type semiconductor substrate and n-type source and drain regions, as a model.

Prior to the description of the excess current, a structure of an EEPROM shown in FIG. 7 will be explained. An n-type drain region 702 and an n-type source region 703 are provided in a p-type semiconductor substrate 701. A floating gate 705, a part of which extends to the drain region 702, is disposed through a first gate insulating film 704 above a channel region which is defined between these n-type regions 702 and 703. A control gate 707 is provided above the floating gate through an interlevel insulator 706. A side wall insulating film 708 is provided on a side wall of a stacked gate constituted by these gates, and a second gate insulating film 709 integrally formed with the side wall insulating film is provided on the channel region. A select gate 710 is provided on both the second gate insulating film 709 and the side wall insulating film 708.

FIG. 7 shows a state wherein a voltage is applied during erasing to the memory cell of the EEPROM having the above structure. That is, a high voltage is applied to the n-type drain region 702 (reference numeral 711 in FIG. 7 denotes a depletion layer). As a result, electrons 712 (charge carrier) stored in the floating gate 705 are removed through the first gate insulating film 704 to the n-type drain region 702 provided in the substrate 701. At this time, a large number of electrons and holes are generated at the interface between the first gate insulating film 704 and the n-type drain region 702 to cause an increase in drain current. That is, the excess drain current may bring about.

The generation of a large number of electrons and holes will be described in detail with reference to an energy band diagram shown in FIG. 8.

A region represented by reference numeral 801 in the drawing is a region corresponding to the floating gate 705 shown in FIG. 7, reference numeral 802 denotes a region corresponding to the first gate insulating film 704 shown in FIG. 7, and reference numeral 803 denotes a region corresponding to the n-type drain region 702 shown in FIG. 7. In addition, reference numeral 804 denotes a conduction band of a semiconductor (e.g., silicon), and reference numeral 805 denotes a valence band thereof. FIG. 8 shows a state wherein a high voltage is applied to the n-type drain region 702, i.e., the region 803 in FIG. 8. When the high voltage is applied to the n-type drain region 702, the band which is present in the region 803 in FIG. 8 is bent, so that the width of the forbidden band 806 located near the first gate insulating film 704 (e.g., silicon oxide) is decreased. When the width of the forbidden band 806 is decreased, electrons 715 which are present in the valence band 805 are transferred to the conduction band 804 by a tunnelling phenomenon, whereby, so-called the band-to-band tunnelling occurs. Holes 714 are left in the valence band 805. The electrons 715 flow through the n-type drain region 702, i.e., a high potential power supply, and the holes 714 flow through the substrate 701, i.e., a low potential power supply such as the ground, thereby causing an increase in the drain current.

In the conventional erasing method described above, since the charge carrier stored in the floating gate 705 is removed by applying the high voltage to the region (e.g., n-type drain region 702) provided in the substrate 701 connected to the low voltage power supply, the problem of the excess current generated by the band-to-band tunnelling cannot be avoided. As described above, when the excess current is generated during erasing, an electric potential cannot be satisfactorily applied to the device by using an internal step-up means such as charge pumping circuits thereby bringing about unwanted voltage drop. Therefore, various problems such as undesired delay of the erasing time, unsatisfactory removal of the charge carrier, etc., may occur. That is, in the conventional EEPROM, it is difficult to perform the erase operation by the internal step-up means.

SUMMARY OF THE INVENTION

It is, therefore, an object of the present invention to provide a nonvolatile semiconductor memory device capable of erasing stored information without applying an excess current to a drain region during erasing, and a method of erasing the stored information therefrom.

It is another object of the present invention to provide a nonvolatile semiconductor memory device and its operating for enabling writing, reading, and erasing operations by using only a single power supply.

According to an aspect of the present invention, in a nonvolatile semiconductor memory device which comprises a semiconductor substrate of one conductivity type, source and drain regions of opposite conductivity type for defining a channel region therebetween, a gate insulating film provided on the channel region and overlapping the drain region, and a stacked gate including a floating gate provided on the gate insulating film and a control gate disposed above the floating gate through an interlevel insulator, an erase gate is provided which is located above the channel region through an insulating film which is contiguous to the gate insulating film and overlaps the stacked gate. The erase gate is also insulated from the stacked gate through a side wall insulating film. When a positive high voltage is applied to the erase gate, a charge carrier stored in the floating gate will be removed through the side wall insulating film therefrom.

According to another aspect of the present invention, there is provided a method of erasing stored information of the nonvolatile semiconductor memory device according to a principle incorporated in the firstly referred aspect of the present invention.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings, in which:

FIG. 1 is a plan view showing an EEPROM according to the first embodiment of the present invention;

FIG. 2 is a sectional view showing the EEPROM taken along a line A—A' in FIG. 1;

FIGS. 3A to 3F are sectional views showing a process for making the EEPROM according to the first embodiment of the present invention;

FIGS. 6A to 6F are sectional views showing a process for making the EEPROM according to the second embodiment of the present invention;

DETAILED DESCRIPTION OF THE PREFERRED EMBODIMENTS

Figure 3A:
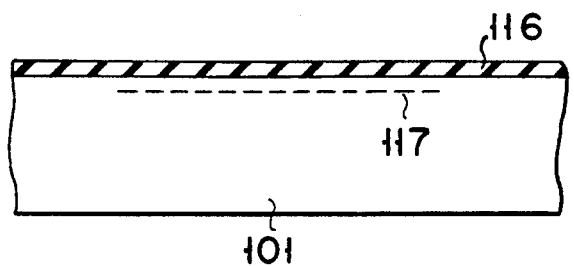

The structure and operation of an EEPROM according to the first embodiment of the present invention will be described below.

As shown in FIGS. 1 and 2, an n-type drain region 102 and an n-type source region 103 are provided in, e.g., a p-type semiconductor substrate 101. A floating gate 106, a part of which extends to the drain region 102, is disposed through a gate insulating film 105 above a channel region 104 provided between the n-type regions 102 and 103. A control gate 108 is provided above the floating gate 106 through an interlevel insulator 107. A side wall insulating film 109 is provided on a side wall of a stacked gate constituted by these gates, and an insulating film 110 integrally formed with the side wall insulating film is provided on the channel region. An erase gate 111 is disposed on both the insulating film 110 and the side wall insulating film 109. A first terminal 112 is connected to the n-type drain region 102 through a contact hole 112' as shown in FIG. 1, and in the same manner, a second terminal 113 is connected to the n-type source region 103 through a contact hole 113'. A third terminal 114 is connected to the control gate 108 through a contact hole 114', and a fourth terminal 115 is connected to the erase gate 111 through a contact hole 115', respectively.

A method of operating the device according to the first embodiment will be described below.

As a basic operation of the device according to the first embodiment, writing, reading and erasing operations are provided.

These three basic operations will be described below.

(1) Writing operation

For writing information, the substrate 101 and the source 103 are grounded, and a positive voltage is applied to the control gate 108, erase gate 111, and drain 102, respectively. Thus, channel hot electrons are injected into the floating gate 106 through the gate insulating film 105, thereby performing the writing operation.

As practical voltages applied during writing, voltages of 12.5 V, 1.5 V and 5 V are applied to the control gate 108, the erase gate 111 and the drain region 102, respectively, while grounding the substrate 101 and the source region 103.

During injection of the channel hot electrons, the device according to the first embodiment has the following advantages.

That is, most of electrons are injected into the floating gate 106 through a portion between the insulating film 110 and the gate insulating film 105, especially, through the gate insulating film 105 located at a side of the floating gate 106. That is, in the structure of the device according to the first embodiment, the erase gate 111 and the control gate 108 are electrically isolated from each other. Therefore, different potentials can be applied to the erase gate 111 and the control gate 108 during writing, respectively. For example, a voltage of 12.5 V is applied to the gate 108, and a voltage of 1.5 V is applied to the erase gate 111. As a result, the highest electric field region is provided near the interface between the insulating film 110 and the gate insulating film 105, especially, near the gate insulating film 105 located at the side of the floating gate 106, and the channel hot electrons are injected into the floating gate 106.

(2) Reading operation

For reading the stored information, the substrate 101 and the source region 103 are grounded, and a ground or positive voltage (the voltage depends on an amount of charge which is determined by the memory cell design and which is removed during erasing.) is applied to the control gate 108. Further, a positive voltage higher than that during writing and a positive voltage lower than that during writing are applied to the erase gate 111 and the drain 102, respectively At this time, if electrons have been injected into the floating gate 106 to charge it negatively, a channel is not provided in the channel region 104 under the floating gate 106, so that no channel current of the cell may flow therethrough. On the contrary, if the electrons stored in the floating gate 106 have been removed or discharged to charge it positively, a channel is provided in the channel region under the floating gate 106, so that the channel current of the cell may flow therethrough. Thus, the charging state in the floating gate 106, i.e., stored information can be read out by checking whether the channel is provided in the cell or not.

As practical voltages applied during reading, voltages of 0 V, 0 to 5 V, 5 V, and 1.2 V are applied to the substrate 101 and the source region 103, the control gate 108, the erase gate, and the drain region 102, respectively.

(3) Erasing operation

For erasing the stored information, the substrate 101, the source region 103, the control gate 108, and the drain region 102 are grounded, respectively, while a high positive voltage is applied to the erase gate 111. Therefore, electrons 119 stored in the floating gate 106 are removed to the erase gate 111 through the side wall insulating film 109, thereby erasing the stored information.

As practical voltages applied during erasing, a voltage of 20 V is applied to the erase gate 111, and the substrate 101, the drain region 102, the source region 103 and the control gate 108 are held at zero volt, respectively.

In this erase operation, unlike a conventional erase operation a high potential is not applied to the drain region 102 provided in the substrate 101 connected to the low potential power supply, but a high potential is applied to the erase gate 111 connected to only the high potential power supply. Therefore, unwanted excess current is not generated, and a high positive voltage can be applied to the erase gate 111. When the high positive voltage is applied to the erase gate, a current flows instantaneously therethrough, thereby removing the charge carrier (the electrons 119) stored in the floating gate 106. When the charge carrier is removed from the floating gate 106, a current does not flow through the erase gate since an electric field between the floating gate and the erase gate 111 is reduced. For this reason, an excess erasing current does not flow during erasing. Accordingly, the erasing operation can be performed by internal step-up means.

The removal of electrons is performed through the side wall insulating film 109, while the injection of electrons is carried out through the gate insulating film 105. That is, during erasing and writing operations, insulating films through which electrons pass are different from each other. Thus, the life of the gate insulating film 105 can be increased by changing the insulating film, through which electrons pass, during writing and erasing. As a result, the life of the device according to the first embodiment is made long.

A method of making the EEPROM according to the first embodiment will be described below with reference to FIGS. 3A to 3F.

The same reference numerals in FIGS. 3A to 3F denote the same parts as in FIGS. 1 and 2.

As shown in FIG. 3A, a field oxide film (not shown) is formed by normal LOCOS techniques on a p-type silicon substrate 101 having a resistivity of about 10 Ω·cm and a (100) plane. A region surrounded by the field oxide film is given as an element region. A sacrificial oxide film 116 is formed on the silicon substrate 101 to a thickness of about 100 Å by, e.g., thermal oxidation techniques. Subsequently, a predetermined impurity for controlling a threshold voltage is ion-implanted into an intended channel region of a cell transistor through the sacrificial oxide film 116. Reference numeral 117 in FIG. 3A denotes a region in which the predetermined impurity for controlling the threshold voltage is ion-implanted.

Figure 3B:
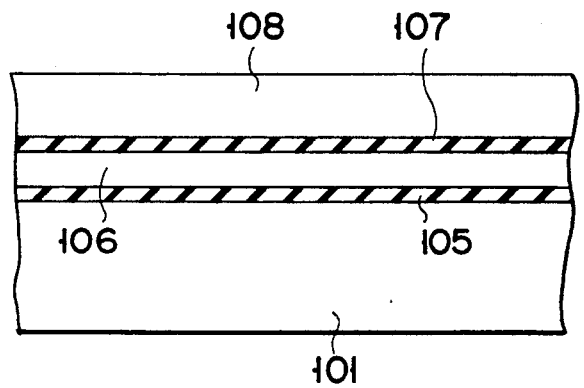

As shown in FIG. 3B, after the sacrificial oxide film 116 is removed by, e.g., an ammonium fluoride ($NH_4F$) solution, a gate oxide film 105 is formed on the substrate surface to a thickness of about 100 Å by thermal oxidation techniques. Thereafter, a first polysilicon layer 106 is deposited on the gate oxide film 105 to a thickness of about 1000 Å by, e.g., LPCVD techniques. Phosphorus is introduced into the first polysilicon layer 106 by vapor phase diffusion using, e.g., phosphoryl chloride ($POCl_3$) to obtain an n-type polysilicon layer. Thereafter, the first polysilicon layer 106 is etched using a photoresist mask, thereby forming cell slits (not shown) for separating floating gates of memory cells from one another. The first polysilicon layer 106 is thermally oxidized to form a silicon oxide film having a thickness of about 100 Å, and a silicon nitride film is deposited to a thickness of about 150 Å by, e.g., LPCVD techniques. In addition, the silicon nitride film is thermally oxidized to form a silicon oxide film having a thickness of about 60 Å. These films thus produced serves as an interlevel insulator 107. A second polysilicon layer 108 is deposited to a thickness of about 4,000 Å by, e.g., LPCVD techniques. Phosphorus is introduced into the second polysilicon layer 108 by vapor phase diffusion using, e.g., phosphoryl chloride ($POCl_3$) to obtain an n-type polysilicon layer.

Figure 3C:
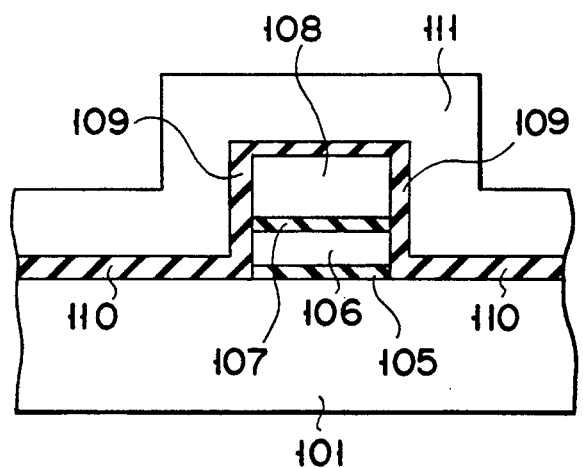

As shown in FIG. 3C, a photoresist layer is patterned, and the second polysilicon layer 108, the interlevel insulator 107, and the first polysilicon layer 106 are etched by anisotropic etching (e.g., RIE techniques), using the photoresist layer as a mask to provide a stacked gate. Thus, the first polysilicon layer 106 becomes a floating-gate configuration, and the second polysilicon layer 108 becomes a control gate configuration. After the gate oxide film 105 remained on the element region is removed by etching, the substrate surface is subjected to a thermal oxidation to form a second gate oxide film 110 to a thickness of about 400 Å on the substrate 101 and to form a side wall insulating film 109 to a thickness of about 800 Å on the side wall of the stacked gate, respectively. Thereafter, a third polysilicon layer 111 is deposited over the substrate surface to a thickness of about 5,000 Å by, e.g., LPCVD techniques. Phosphorus is introduced into the third polysilicon layer 111 by vapor phase diffusion using, e.g., phosphoryl chloride ($POCl_3$) to obtain an n-type polysilicon layer.

As shown in FIG. 3D, the third polysilcon layer 111 is selectively removed through a photoresist mask, which is patterned to cover the contact region around the contact hole 115' in FIG. 1, by anisotropic etching (e.g., RIE techniques) so as to leave both side portions of the stacked gate.

As shown in FIG. 3E, the third polysilicon layer 111 on one side of the stacked gate is removed through a photoresist mask by isotropic etching such as CDE techniques. The third polysilicon layer 111 is then remained on the other side of the stacked gate. Thus, the third polysilicon layer 111 becomes a configuration of an erase gate. A photoresist layer is patterned so as to cover the erase gate 111 therewith, and arsenic ions serving as, e.g., an n-type impurity are implanted into an opposite side of the erase gate 111 at a dose of, e.g., $1 \times 10^{15}$ cm$^{-2}$ to form a first impurity region 102a in the substrate 101. Phosphorus ions serving as, e.g., an n-type impurity are implanted into the opposite side at a dose of, e.g., $1 \times 10^{14}$ cm$^{-2}$ to form a second impurity region 102b in the substrate 101. The n-type drain region 102 is constituted by these two impurity diffused layers 102a and 102b. A photoresist layer is patterned so as to cover the opposite side of the erase gate 111, and arsenic ions serving as an n-type impurity are implanted into the side of the erase gate 111 at a dose of, e.g., $5 \times 10^{15}$ cm$^{-2}$ to form an n-type source region 103 in the substrate 101.

As shown in FIG. 3F, a second interlevel insulator 118 is deposited on the entire surface of the resultant structure. After the second interlevel insulator 118 is reflowed at a temperature of 900° C. so as to be planarized, contact holes 112', 113', 114' (not shown) and 115' (not shown) are formed therein. An electrode wiring material of, e.g., aluminum is deposited over the substrate surface, and patterned to provide conductive layers connected to the drain region 102, the source region 103, the control gate 108, and the erase gate 111, respectively. In FIG. 3F, conductive layers 112 and 113 connected to the drain and source regions 102 and 103 are only illustrated. A sintering process for stabilizing characteristics of the device is performed. Thereafter, a passivation film (not shown) is deposited on the resultant structure, and predetermined contact holes are formed therein.

The EEPROM according to the first embodiment can be made as described above.

A nonvolatile semiconductor memory device (EEPROM) according to a second embodiment of the present invention and a method of operating the memory device will be described below with reference to FIGS. 4 and 5.

Figure 4:
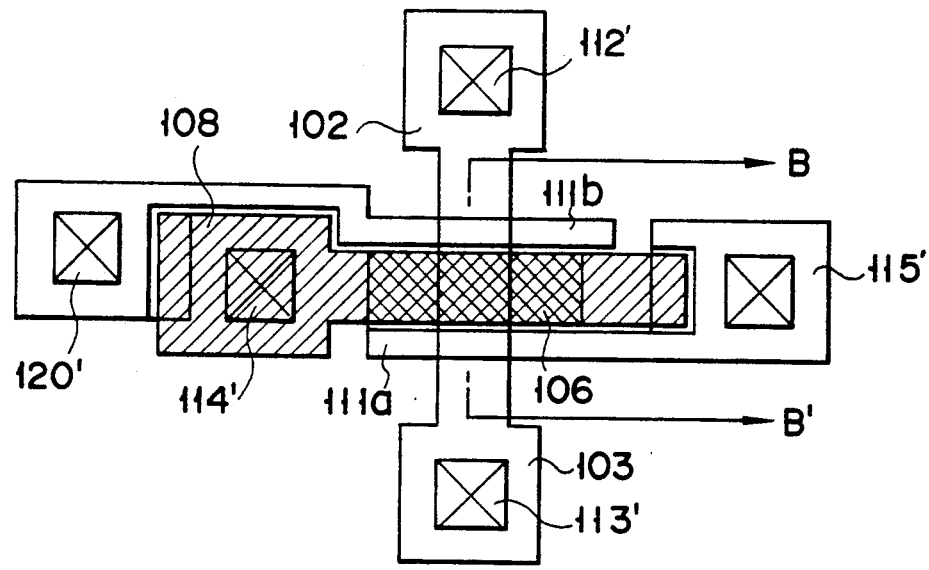
FIG. 4 is a plan view showing an EEPROM according to the second embodiment of the present invention.

FIG. 4 is a plan view of an EEPROM according to the second embodiment, especially showing a memory cell portion. FIG. 5 is a sectional view showing the EEPROM taken along a line B—B' in FIG. 4. The same reference numerals in FIGS. 4 and 5 denote the same parts as in FIGS. 1 and 2.

Figure 5:
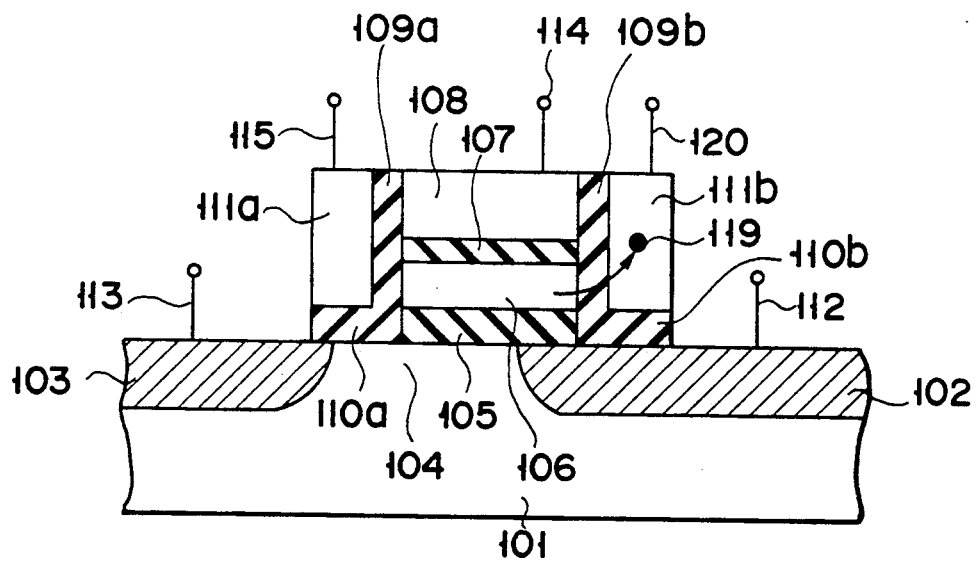
FIG. 5 is a sectional view showing the EEPROM taken along a line B—B' in FIG. 4.
Figure 7:
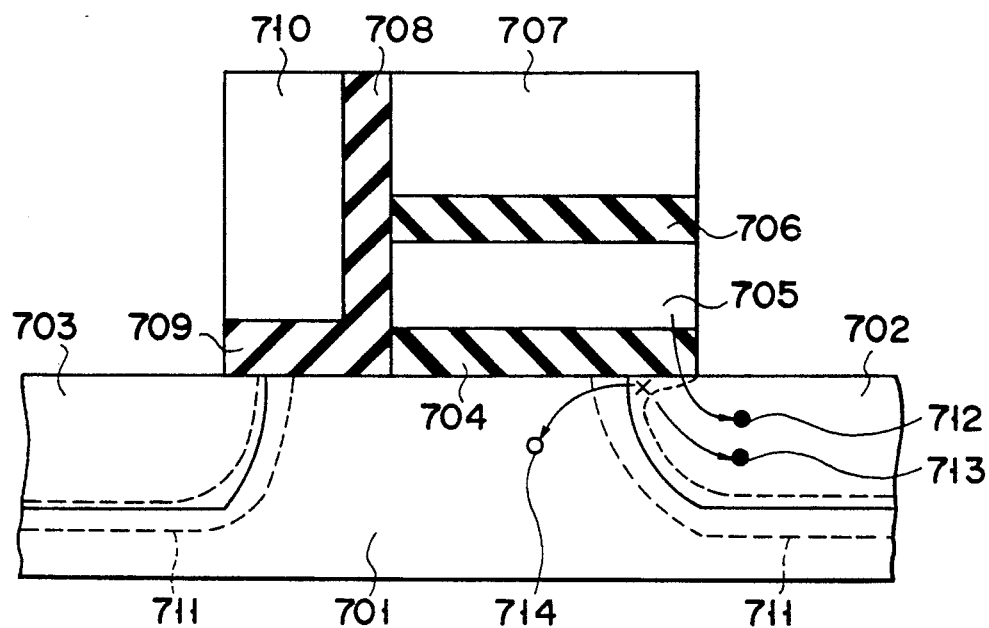
FIG. 7 is a sectional view showing a conventional EEPROM for explaining a discharge state of a stored carrier.
Figure 8:
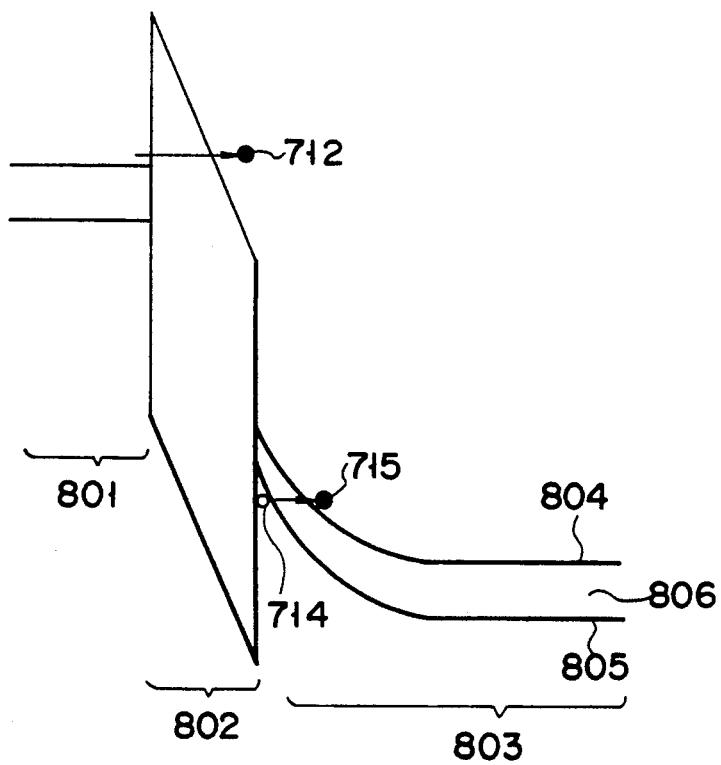
FIG. 8 is an energy band diagram for explaining a conventional problem.

As shown in FIGS. 4 and 5, an n-type drain region 102 and an n-type source region 103 are provided in, e.g., a p-type semiconductor substrate 101. A floating gate 106, a part of which extends to the drain region 102, is provided through a gate insulating film 105 above a channel region 104 provided between the n-type regions 102 and 103. A control gate 108 is disposed above the floating gate 106 through an interlevel insulator 107. First and second side wall insulating films 109a and 109b are provided on both side walls of a stacked gate constituted by these gates. A first insulating film 110a integrally formed with the first side wall insulating film 109a is provided on the channel region. A second insulating film 110b integrally formed with the second side wall insulating film 109b is provided on the n-type drain region 102. A select gate 111a is disposed on both the first insulating film 110a and the first side wall insulating film 109a. An erase gate 111b is disposed on both the second insulating film 110b and the second side wall insulating film 109b. A first terminal 112 is connected to the n-type drain region 102 through a contact hole 112' as shown in FIG. 4. In the same manner, a second terminal 13 is connected to the n-type source region 103 through a contact hole 113'. A third terminal 114 is connected to the control gate 108 through a contact hole 114', and a fourth terminal 115 is connected to the select gate 111a through a contact hole 115'. A fifth terminal 120 is connected to the erase gate 111b through a contact hole 120'.

A method of operating the device according to the second embodiment will be described below.

As a basic operation of the device according to the second embodiment, three operations, i.e., writing, reading and erasing operations are provided.

These three basic operations will be described below.

(1) Writing operation

For writing information, the substrate 101 and the source region 103 are grounded, and a positive voltage is applied to the control gate 108, the select gate 111a, the erase gate 111b and the drain region 102, respectively. Thus, channel hot electrons are injected into the floating gate 106 through the gate insulating film 105, thereby writing information thereto.

As practical voltages applied during writing, voltages of 12.5 V, 1.5 V, 5 V, and 5 V are applied to the control gate 108, the select gate 111a, the erase gate 111b, and the drain region 102, respectively, while grounding the substrate 101 and the source region 103.

In the device according to the second embodiment, channel hot electrons are injected into the floating gate 106 through a portion between the insulating film 110a and the gate insulating film 105, especially, through the gate insulating film 105 located at a side of the floating gate 106 in the same manner as the first embodiment.

(2) Reading operation

For reading the stored information, the substrate 101 and source region 103 are grounded, a ground or positive voltage (the voltage depends on an amount of charge which is determined by the memory cell design and which is removed from the floating gate 106 during erasing) is applied to the control gate 108 and the erase gate 111b. A positive voltage higher than that applied during writing is applied to the select gate 111a, and a positive voltage lower than that applied during writing is applied to the drain region 102. At this time, if electrons have been injected into the floating gate 106 to charge it negatively, a channel is not provided in the channel region 104 under the floating gate 106, so that no channel current may flow therethrough. On the contrary, if electrons stored in the floating gate 106 have been removed or discharged to charge it positively, a channel is provided in the channel region 104 under the floating gate 106, so that the channel current may flow therethrough. Thus, the charging condition in the floating gate 106, i.e. stored information can be read by checking whether the channel is provided in the cell or not.

As practical voltages applied during reading of information, voltages of 0 V, 0 to 5 V, 5 V, and 1.2 V are applied to the substrate 101 and the source region 103, the control gate 108 and the erase gate 111b, the select gate 111a, and the drain region 102, respectively.

(3) Erasing operation

For erasing the stored information, the substrate 101, the source region 103, the control gate 108, the drain region 102 and the selection gate 111a are grounded, and a very high positive voltage is applied to the erase gate 111b. Thus, electrons 119 stored in the floating gate 106 are removed to the erase gate 111b through the second side wall insulating film 109b, thereby erasing the stored information.

As practical voltages applied during erasing of information, a voltage of 20 V is applied to the erase gate 111b, and the substrate 101, the drain region 102, the source region 103, the control gate 108 and the select gate 111a are held at zero volt, respectively.

When the charge carrier is removed from the floating gate 106, a current does not further flow through the erase gate 111b since an electric field between the floating gate 106 and the erase gate 111b is reduced. For this reason, an excess erasing current does not flow during erasing in the same manner as the first embodiment. Accordingly, the erasing operation can be performed by internal step-up means.

The removal of electrons is performed through the second side insulating film 109b, while the injection of electrons is carried out through the first gate insulating film 105. Accordingly, since the different insulating films are used, the life of the device according to the second embodiment can be increased in the same manner as the first embodiment.

A method of making the EEPROM according to the second embodiment will be described below with reference to FIGS. 6A to 6F.

As shown in FIG. 6A, a field oxide film (not shown) is formed by normal LOCOS techniques on a p-type silicon substrate 101 having a resistivity of, e.g., about 10 Ω·cm and a (100) plane. A region surrounded by the field oxide film 116 is formed on the silicon substrate 101 to a thickness of about 100 Å by, e.g., thermal oxidation techniques. Subsequently, a predetermined impurity for controlling a threshold voltage is ion-implanted into an intended channel region of a cell transistor through the sacrificial oxide film 116. Reference numeral 117 in FIG. 6A denotes a region in which the predetermined impurity for controlling the threshold voltage is ion-implanted.

As shown in FIG. 6B, after the sacrificial oxide film 116 is removed by, e.g., an ammonium fluoride (NH$_4$F) solution, a gate oxide film 105 is formed on the substrate surface to a thickness of about 100 Å by thermal oxidation techniques. Thereafter, a first polysilicon layer 106 is deposited on the gate oxide film to a thickness of about 1,000 Å by e.g., LPCVD techniques. Phosphorus is introduced into the first polysilicon layer 106 by vapor phase diffusion using, e g , phosphoryl chloride (POCl$_3$). Thereafter, the first polysilicon layer 106 is etched using a photoresist mask, thereby forming cell slits (not shown) for separating floating gates of memory cells from one another. The first polysilicon layer 106 is thermally oxidized to form a silicon oxide film having a thickness of about 100 Å, and a silicon nitride film is deposited to a thickness of about 150 Å by, e.g., LPCVD techniques. In addition, the silicon nitride film is thermally oxidized to form a silicon oxide film having a thickness of about 60 Å. These films thus produced serves as an interlevel insulator 107. A second polysilicon layer 108 is deposited on the interlevel insulator 107 to a thickness of about 4,000 Å by, e.g., LPCVD techniques. Phosphorus is introduced into the second polysilicon layer 108 by a vapor phase diffusion using, e.g., phosphoryl chloride (POCl$_3$).

As shown in FIG. 6C, a photoresist layer is patterned, and the second polysilicon layer 108, the interlevel insulator 107, and the first polysilicon layer 106 are etched by anisotropic etching (e.g., RIE techniques), using the photoresist as a mask to form a stacked gate. Thus, the first polysilicon layer 106 becomes a floating gate configuration, and the second polysilicon layer 108 becomes a control gate configuration. A photoresist layer is patterned so as to cover a part of the substrate surface including the stacked gate, and arsenic ions serving as, e.g., an n-type impurity are of, e.g., $1 \times 10^{15}$ cm$^{-2}$ to form a first impurity region 102a. Phosphorus ions serving as, e.g., an n-type impurity are implanted into the exposed substrate at a dose of, e.g., $1 \times 10^{14}$ cm$^{-2}$ to form a second impurity 102 is constituted by these two impurity regions 102a and 102b. The gate oxide film 105 remained on the element region is removed by etching, and for example, thermal oxidation is performed to form first and second oxide films 110a and 110b, each having a thickness of about 400 Å, on the substrate 101 and to form first and second side wall insulating films 109a and 109b, each having a thickness of about 800 Å, on the side wall of the stacked gate, respectively. A third polysilicon layer 111 is deposited to a thickness of about 5,000 Å by, e.g., LPCVD techniques. Phosphorus is introduced into the third polysilicon layer 111 by vapor phase diffusion using, e.g., phosphoryl chloride (POCl$_3$).

As shown in FIG. 6D, the third polysilicon layer 111 is selectively removed through a photoresist mask, which is patterned to cover contact regions around the contact holes 115' and 120' in FIG. 4, by anisotropic etching (e.g., RIE techniques) so as to leave both side portions of the stacked gate.

As shown in FIG. 6E, the third polysilicon layers 111a and 111b are provided on both side surfaces of the stacked gate by selectively etching the polysilicon layer 111, and serves as a select gate and an erase gate, respectively. A photoresist layer is patterned so as to cover a part of the substrate surface including the erase gate 111b, and arsenic ions serving as, e.g., an n-type impurity are implanted into the exposed substrate surface, e.g., into the side of the select gate, at a dose of, e.g., $5 \times 10^{15}$ cm$^{-2}$ to form an n-type source region 103 in the substrate 101.

As shown in FIG. 6F, a second interlevel insulator 118 is deposited on the entire surface of the resultant structure. After the second interlevel insulating film 118 is reflowed at a temperature of 900° C. so as to be planarized, contact holes 112', 113', 114' (not shown), 115' (not shown) and 120' (not shown) are formed therein. An electrode wiring material of, e.g., aluminum is deposited over the substrate surface, and patterned to provide conductive layers connected to the drain region 102, the source region 103, the control gate 108, the select gate 111a, and the erase gate 111b, respectively. In FIG. 6F, conductive layers 112 and 113 respectively connected to the drain region 102 and the source region 103 are only illustrated. A sintering process for stabilizing characteristics of the device is performed. Thereafter, a passivation film (not shown) is deposited on the resultant structure, and predetermined contact holes are formed in therein.

The EEPROM according to the second embodiment can be made as described above.

It is further understood by those skilled in the art that the foregoing description is preferred embodiments of the disclosed device and that various changes and modifications may be made in the invention without departing from the spirit and scope thereof.

What is claimed is:

1. A nonvolatile semiconductor memory device comprising:
   a semiconductor substrate of one conductivity type having source and drain regions of opposite conductivity type for defining a channel region therebetween;

a stacked gate provided on said channel region, said stacked gate including a gate insulating film overlapping said drain region, a floating gate disposed on said gate insulating film and a control gate provided through an interlevel insulator above said floating gate, an erase gate provided above said channel region through an insulating film contiguous to said gate insulating film, said insulating film overlapping said source region, said erase gate being insulated from said stacked gate through a side wall insulating film, and an electrode provided on said source and drain regions, said control gate and said erase gate, respectively.

2. A nonvolatile semiconductor memory device according to claim 1, wherein a thickness of said gate insulating film is of the order of 100 Å.

3. A nonvolatile semiconductor memory device according to claim 1, wherein a thickness of said side wall insulating film is of the order of 800 Å.

4. A nonvolatile semiconductor memory device according to claim 1, wherein a comparatively low impurity concentration region of opposite conductivity type is provided underneath said drain region.

5. A nonvolatile semiconductor memory device according to claim 1, wherein said channel region has a controlled threshold voltage.

6. A nonvolatile semiconductor memory device according to claim 1, wherein said interlevel insulator is comprised of a silicon oxide film, a silicon nitride film and a silicon oxide film.

7. A nonvolatile semiconductor memory device comprising:

a semiconductor substrate of one conductivity type having source and drain regions of opposite conductivity type for defining a channel region therebetween;

a stacked gate provided on said channel region, said stacked gate including a gate insulating film overlapping said drain region, a floating gate disposed on said gate insulating film and a control gate provided through an interlevel insulator above said floating gate, a select gate provided above said channel region through an insulating film contiguous to said gate insulating film, said insulating film overlapping said source region, said select gate being insulated from said stacked gate through one side wall insulating film, an erase gate provided above said drain region through an insulating film contiguous to said gate insulating film, said erase gate being insulated from said stacked gate through the other side wall insulating film, and an electrode provided on said source and drain regions, said control gate, said select gate and said erase gate, respectively.

8. A nonvolatile semiconductor memory device according to claim 7, wherein a thickness of said gate insulating film is of the order of 100 Å.

9. A nonvolatile semiconductor memory device according to claim 7, wherein a thickness of each of said side wall insulating film is of the order of 800 Å.

10. A nonvolatile semiconductor memory device according to claim 7, wherein said channel region has a controlled threshold voltage.

11. A nonvolatile semiconductor memory device according to claim 7, wherein said interlevel insulator is comprised of a silicon oxide film, silicon nitride film and a silicon oxide film.

* * * * *